United States Patent
Amaike et al.

(10) Patent No.: US 6,724,617 B2
(45) Date of Patent: Apr. 20, 2004

(54) SERVER UNIT COMPRISING STACKED MULTIPLE SERVER UNIT CABINETS ACCOMMODATING MULTIPLE CARTRIDGE TYPE SERVER UNITS

(75) Inventors: Takeshi Amaike, Tokyo (JP); Seon Meyong Heo, c/o Internet Research Institute, Inc., Shinmuromachi Bldg. 10F., 4-3, Nihonbashimuromachi 2-chome, Chuo-ku, Tokyo (JP); Makoto Watanabe, Tokyo (JP); Takayuki Yasaku, Tokyo (JP); Shinya Izumi, Tokyo (JP); Naoya Shikamura, Tokyo (JP)

(73) Assignees: Internet Research Institute, Inc., Tokyo (JP); Seon Meyong Heo, Tokyo (JP); Trustguard Co., Ltd., Tokyo (JP)

( * ) Notice: Subject to any disclaimer, the term of this patent is extended or adjusted under 35 U.S.C. 154(b) by 0 days.

(21) Appl. No.: 10/458,638

(22) Filed: Jun. 11, 2003

(65) Prior Publication Data

US 2003/0235025 A1 Dec. 25, 2003

Related U.S. Application Data

(63) Continuation of application No. 09/906,682, filed on Jul. 18, 2001, now Pat. No. 6,621,713.

(30) Foreign Application Priority Data

Jul. 19, 2000 (JP) ........................................ 2000-219367

(51) Int. Cl.[7] .................................................. H05R 5/00
(52) U.S. Cl. ........................ 361/683; 361/752; 361/797; 361/686; 361/687; 361/688
(58) Field of Search .................................. 361/683, 797, 361/752, 709, 719, 687, 688, 629; 174/15.2

(56) References Cited

U.S. PATENT DOCUMENTS 4,793,405 A 12/1988 Diggelmann et al. .. 165/104.33

(List continued on next page.)

OTHER PUBLICATIONS

Hammer et al. "Ventilation system for data processing systems" IBM Technical Disclosure Bulletin, IBM Corp., New York, US, vol. 17, No. 9. (Feb. 1975) pp. 2529–2530.

*Primary Examiner*—David Martin
*Assistant Examiner*—Hung Bui
(74) *Attorney, Agent, or Firm*—Westerman, Hattori, Daniels & Adrian, LLP (57) ABSTRACT

An object of the invention is to provide a server unit, which is so structured as to enable efficient cooling and which can be installed in great numbers in a server unit cabinet, and which comprises a cartridge type server unit 3 comprising (a) a printed circuit board 31 for a server unit, which is equipped with a central processing unit (CPU) and main memory and which serves as a computer with the supply of external electric power at constant voltage, (b) a heat sink 33 supported by the printed circuit board 31 for the server unit, and (c) a front panel 35 which supports the printed circuit board 31 for the server unit; wherein the front panel 35 supports the printed circuit board 31 so that a flat surface of the printed circuit board 31 is positioned vertically when the server unit 3 is accommodated, wherein a part of a heat sink 33 makes contact with highly heat-generating components mounted on the printed circuit board 31 via heat conduction means, and wherein a heat pipe 331 is provided to transmit heat from said contacting part to another part of the heat sink.

10 Claims, 4 Drawing Sheets

U.S. PATENT DOCUMENTS

| | | | |
|---|---|---|---|
| 5,339,214 A | 8/1994 | Nelson | 361/695 |
| 5,409,055 A | 4/1995 | Tanaka et al. | 165/104.33 |
| 5,684,671 A | 11/1997 | Hobbs et al. | 361/683 |
| 5,684,674 A | 11/1997 | Yin | 361/695 |
| 5,731,954 A * | 3/1998 | Cheon | 361/699 |
| 5,852,547 A * | 12/1998 | Kitlas et al. | 361/695 |
| 5,946,191 A | 8/1999 | Oyamada | 361/700 |
| 5,986,882 A | 11/1999 | Ekrot et al. | 361/687 |
| 6,002,586 A * | 12/1999 | Chen et al. | 361/695 |
| 6,050,327 A * | 4/2000 | Gates | 165/80.3 |
| 6,229,704 B1 | 5/2001 | Hoss et al. | 361/704 |
| 6,411,511 B1 | 6/2002 | Chen | 361/697 |
| 6,438,984 B1 | 8/2002 | Novotny et al. | 62/259.2 |
| 6,637,505 B1 * | 10/2003 | Sasaki | 165/122 |

\* cited by examiner

SERVER UNIT COMPRISING STACKED MULTIPLE SERVER UNIT CABINETS ACCOMMODATING MULTIPLE CARTRIDGE TYPE SERVER UNITS

This application is a continuation of prior application Ser. No. 09/906,682 filed Jul. 18, 2001 now U.S. Pat. No. 6,621,713.

FIELD OF THE INVENTION

The present invention relates to a cartridge type server unit comprising (a) a printed circuit board for a server unit, mounted with a CPU and memory which operate with external constant voltage, (b) a front panel which supports the printed circuit board for the server unit, and (c) connectors provided on the printed circuit board for the server unit, and eliminating the need of additional wiring. The invention also relates to a server unit cabinet which accommodates multiple pieces of said server unit therein.

DESCRIPTION OF THE RELATED ART

With rapid development of the Internet, burdens on Internet servers have become so large that servers might hang up. To cope with an increased load on servers, one option is to increase the capacity of a server itself. However, such a capacity increase has a limit, and multiple server units are installed to disperse the increased load.

If multiple server units are grouped so as to function as a single server, each server unit is not required to be a high-performance workstation, but a so-called PC server can well do for the purpose. In this case, several hundred PC servers must be installed on one site. When a user accesses this site, he/she will be led to one of the installed PC servers. An increase in the load can be coped with by increasing PC servers.

To install several hundred server units, a considerably large space is required. If it is taken into account that a power source, a cooling method, and safety control be provided, the cost for the installation space will further increase. In addition, it is predicted that several server units will be added every month. The maintenance work including accurate wiring and replacement of server units which have failed will become a very serious problem.

Normally, on a site where a larger number of server units are installed, multiple server units are accommodated in a server unit rack which extends vertically, so that the space can be effectively utilized in that direction. For example, a server unit rack called a 19" rack has a width of 19 inches (482.6 mm) and a height equivalent to 42 units (1871.1 mm: 1 U=44.45 mm). If typical tower type server units are used, a single rack allows only 4 to 6 units to be installed.

In order to solve this problem with the space for installing server units, a server unit with a thickness of 1 U has been developed. 42 units of said server have been stacked without clearance in a single rack. In this method, however, since a CPU and an HDD must be incorporated in a space of 1 U in thickness, it is difficult to handle heating from these components. As a result, the thickness of a server unit has been changed from 1 U back to 2 U, and clearance for ventilation has been provided for each server unit. Therefore, the number of server units which can practically be installed has decreased to approximately a half.

When a larger number of server units are to be accommodated in a server unit cabinet, it is necessary to supply each server unit with electric power and to connect wiring for signal input/output. These connections are made on the rear of the server unit cabinet. To ensure accuracy, therefore, great care must be taken and troublesome work is required.

SUMMARY OF THE INVENTION

The present invention aims to provide a server unit which is designed to allow a larger number of server units to be accommodated in a server unit cabinet and to be efficiently cooled therein.

It is a further object of the invention to provide a server unit cabinet which can be installed in a server unit rack and which allows multiple server units to be accommodated therein.

An even further object of the invention contemplates the provision of structures of the server unit and server unit cabinet which allow for easily and efficiently making a connection between the server unit and any external device and for quite easily making a connection for power supply.

In order to solve said problem, this invention comprises (a) a printed circuit board for a server unit, which is equipped with a central processing unit (CPU) and main memory and which serves as a computer with the supply of external electric power, (b) a heat sink supported by the printed circuit board for the server unit, and (c) a front panel which supports the printed circuit board for the server unit. The structure of said server unit is such that the front panel supports the printed circuit board for the server unit so as to vertically position a flat surface of the printed circuit board for the server unit when accommodating the server unit, that a part of the heat sink makes contact with highly heat-generating components mounted on the printed circuit board for the server unit via heat conduction means, and that heat conduction means are provided to transmit heat from said contacting part to another part of the heat sink.

According to the invention, the cartridge type server unit is such that a connector having a signal input/output terminal and a power inlet terminal is provided on one side opposite to the side supported by the front panel of the printed circuit board for the server unit.

According to the invention, the cartridge type server unit is such that an extension connector to which an extension board is connected is provided on one surface of the printed circuit board for the server unit.

According to the invention, the cartridge type server unit is such that a heat pipe is used to form the heat transmission means to be provided for the heat sink.

According to the invention, the cartridge type server unit is such that an input/output connector for maintenance use is provided on the front panel and that air vents for cooling are provided on the lower part of the front panel.

In order to further solve the problem, the invention provides a server unit cabinet for accommodating multiple pieces of said cartridge type server unit and at least one constant-voltage power source therein with a server unit space for accommodating multiple server units, a power source space for mounting at least one constant-voltage power source, a signal transmission means space for accommodating signal transmission means, and a cooling space for accommodating cooling means. The invention further provides the server unit cabinet with a server unit connector having a signal input/output terminal and a constant-voltage outlet terminal, and with a power connector having a signal input/output point, an external power inlet terminal, and a constant-voltage power inlet terminal. The invention even further provides the server unit cabinet with (a) a wiring circuit board which includes wiring between the constant-voltage inlet terminal of the power connector and the constant-voltage outlet terminal of the server unit connector, and wiring between the signal input/output terminal of the server unit connector and the signal input/output point, (b) an external signal input/output connector provided on the front of the server unit cabinet, and (c) signal transmission means which connects between said external signal input/output connector and the signal input/output point of said wiring circuit board.

According to the invention the server unit cabinet is such that the input/output point provided on the wiring circuit board is structured as a relay connector, and that the signal transmission means are a cable having a connector which is connected to said relay connector.

According to the invention, the server unit cabinet is such that the signal transmission means connecting between the input/output point provided on the wiring circuit board and the external signal input/output connector are wiring.

According to the invention, the server unit cabinet is such that cooling fans are used as the cooling means.

According to the invention, the server unit cabinet is such that means for guiding a server unit so that a connector provided on the server unit connects to the server unit connector on the wiring circuit board, are provided in the server unit space.

According to the invention, the server unit cabinet is such that means for guiding a constant-voltage power source so that a connector provided on the constant-voltage power source connects to the power connector on the wiring circuit board, are provided in the power source space.

DETAILED DESCRIPTION OF PREFERRED EMBODIMENTS

The configuration of the cartridge type server unit and the server unit cabinet to accommodate cartridge type server units, according to this invention, is described referring to FIGS. 1 through 5.

According to the invention, the cartridge type server unit comprises (a) a printed circuit board for a server unit, on which a CPU (central processing unit) and main memory are mounted, (b) a main connector that centrally provides a power port for constant-voltage inlet mounted on the printed circuit board for the server unit, two LAN ports for signal input/output, and a serial port, (c) a heat sink which partially contacts with highly heat-generating elements mounted on the printed circuit board for the server unit, and (d) a front panel which supports the printed circuit board for the server unit so that a wiring surface thereof is positioned vertically.

Figure 1:
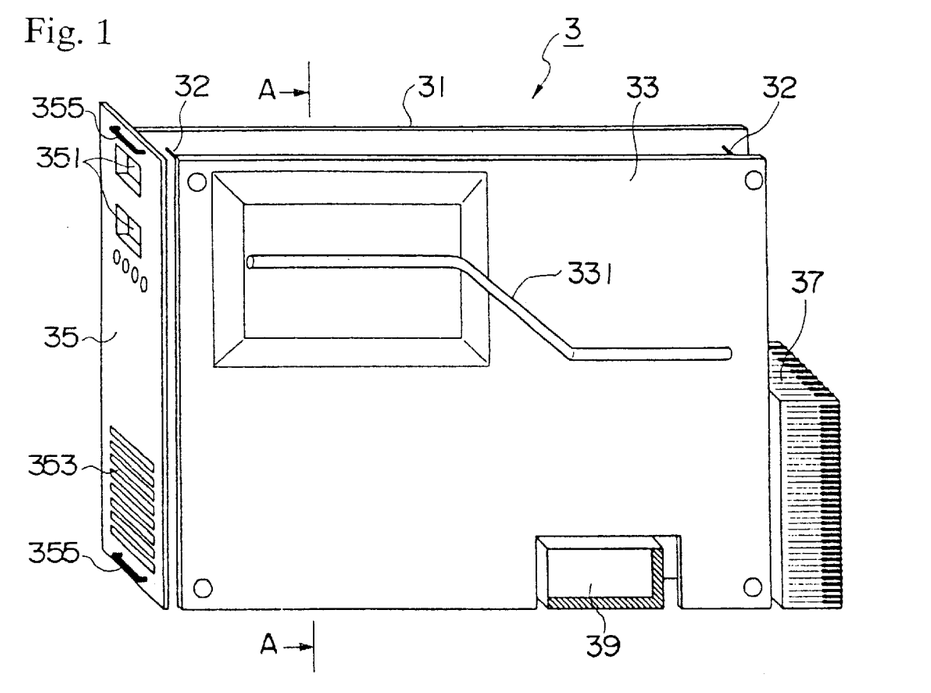
FIG. 1 is a perspective illustration showing the appearance of the server unit according to the invention.
Figure 2:
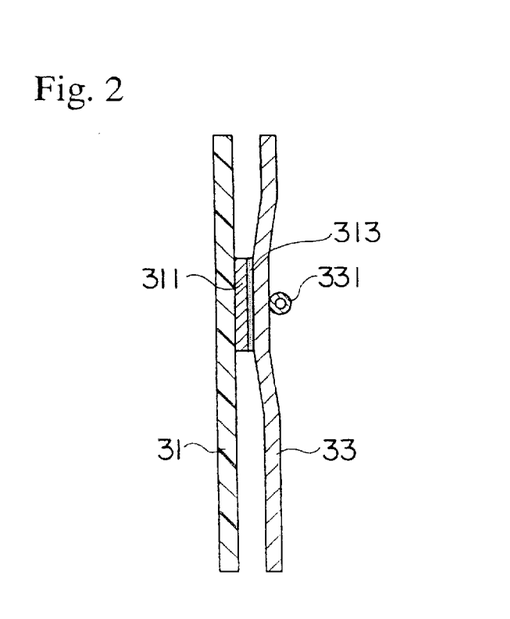
FIG. 2 is a vertical sectional illustration showing the cross section as viewed along the line A—A in FIG. 1.
Figure 3:
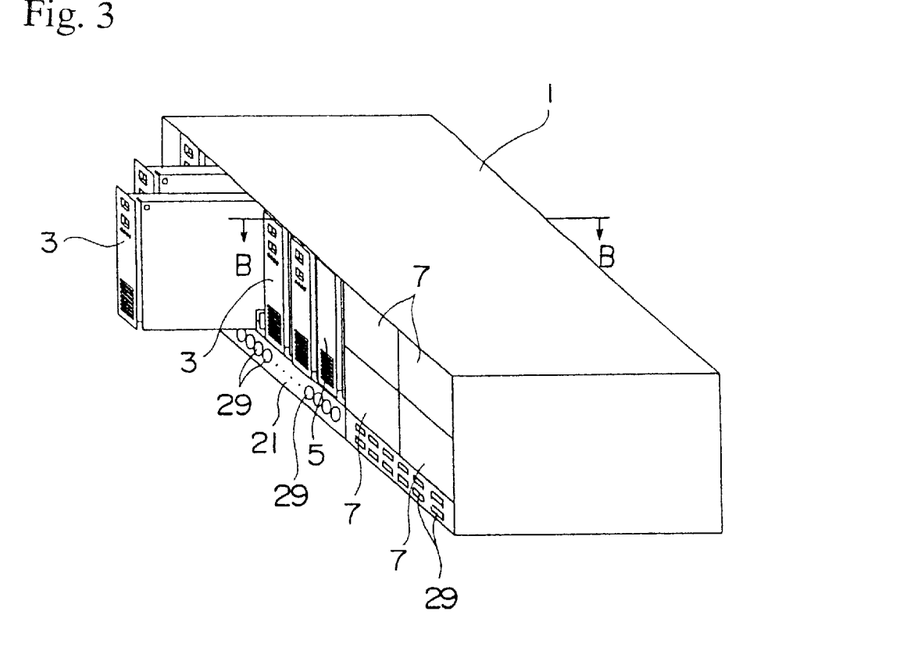
FIG. 3 is a perspective illustration showing the appearance of the cabinet for accommodating server units according to this invention.
Figure 4:
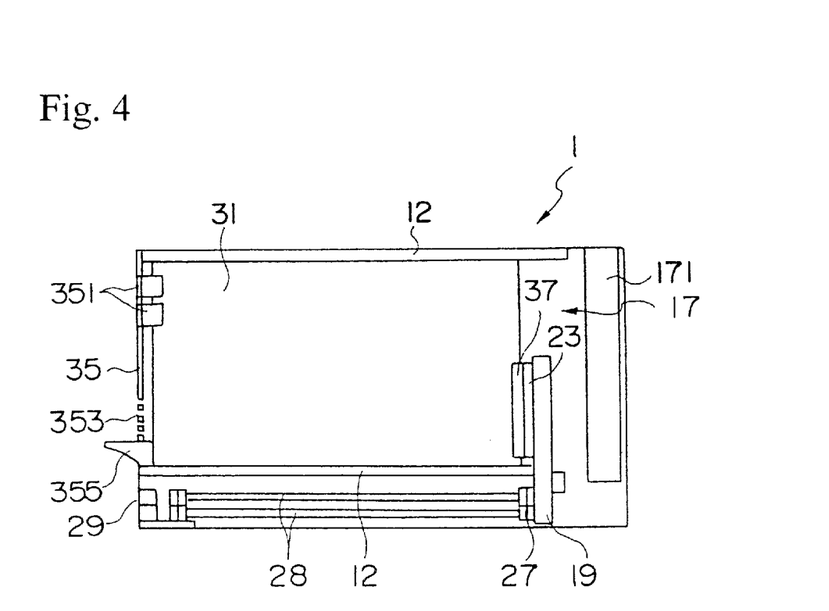
FIG. 4 is a vertical sectional illustration showing the cross section as viewed along the line B—B.
Figure 5:
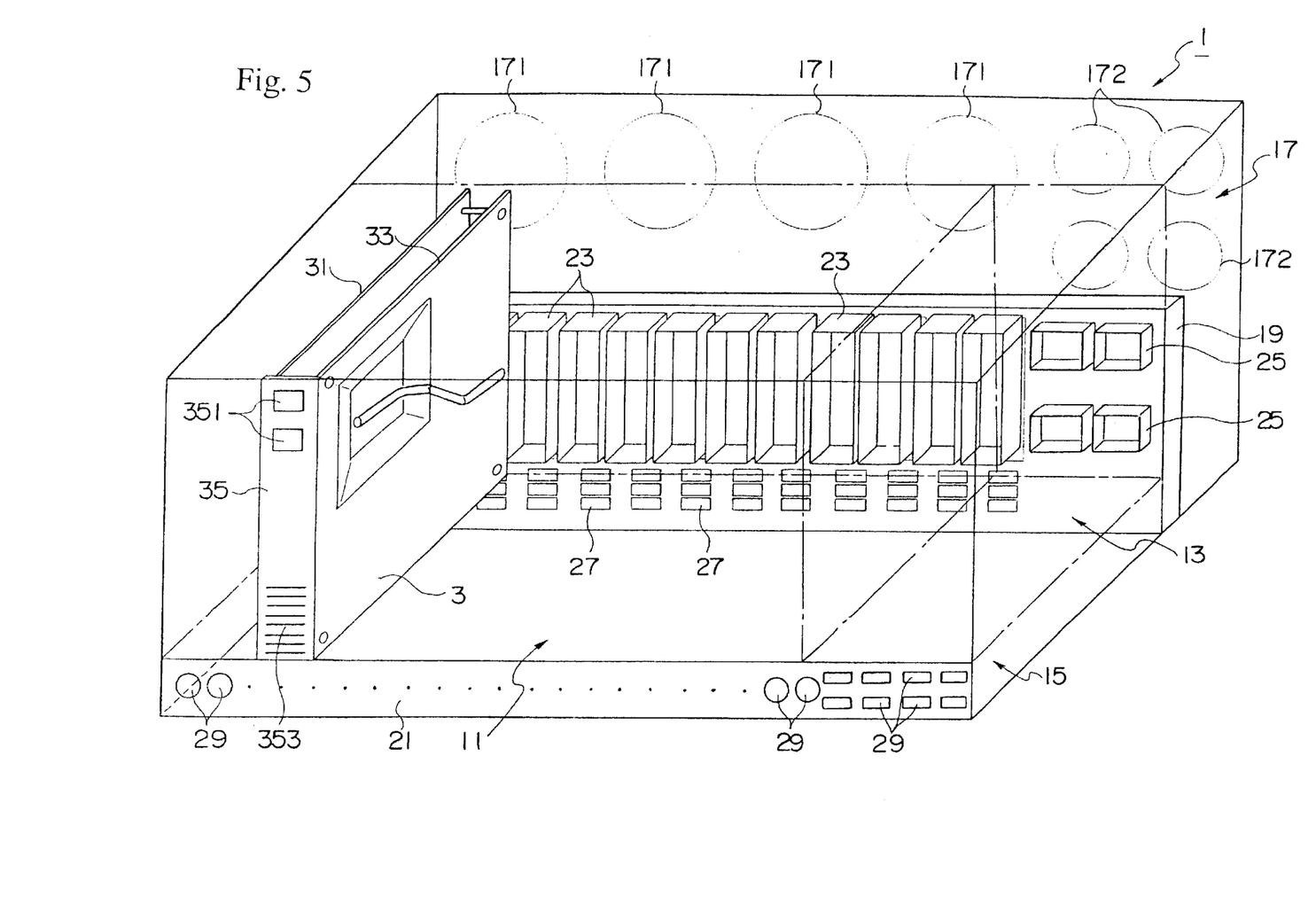
FIG. 5 is a perspective illustration diagrammatically showing the configuration of the cabinet for accommodating server units, which is illustrated in FIG. 3.

FIG. 1 is a perspective illustration showing appearance of the cartridge type server unit according to the invention. FIG. 2 is a vertical sectional view as taken along the line A—A. FIG. 3 is a perspective illustration schematically showing a state in which cartridge type server units are accommodated in the server unit cabinet. FIG. 4 is a vertical sectional view as taken along the line B—B according to FIG. 3 illustrating the state in which said cartridge type server units are accommodated in the server unit cabinet. FIG. 5 is a perspective view conceptually illustrating the structure of the server unit cabinet. In FIGS. 3 through 5, the frame structuring the server unit cabinet is indicated in solid lines without any dimension.

As illustrated in FIGS. 1 and 2, a cartridge type serve unit 3 according to the invention comprises a front panel 35, a printed circuit board 31 (mother board) for a server unit, one side of which is attached to a rear of the front panel 35, a heat sink 33 which is assembled next to the printed circuit board 31 for the server unit, and a main connector 37 which is provided on one side opposite to the printed circuit board 31 for the server unit and the front panel 35 and which has a data input/output terminal and a power inlet terminal.

The front panel 35 has a height of 4 units (U) and a width of 25.4 mm (1 inch). The surface thereof is provided with an input/output connector 315 for maintenance use, air vents 353 for cooling, and a grip 355. The bottom thereof is provided with a support for the printed circuit board 35 for the server unit, which is not illustrated, and means for retaining the front panel 35 when the server unit 3 is accommodated in a server unit cabinet 1.

The printed circuit board 31 for the server unit is sized, e.g., as 160×233.35 mm, and equipped with a CPU 311 and memory so that it can provide functions to perform the necessary processing as the server unit 3. However, the printed circuit board 31 for the server unit does not incorporate a constant-voltage power source or the like which can be shared by multiple server units 3. The printed circuit board 31 for the server unit provides a main connector 37 having a signal input/output terminal and a power inlet terminal on one side thereof, opposite to the front panel 35. The printed circuit board 31 for the server unit also provides on the surface thereof, an extension connector 39 for connecting an extension board (daughter board) 5 which will be installed adjacent thereto.

A heat sink 33 which is supported by a support 31 at a given clearance from the printed circuit board 31 for the server unit, is formed of aluminum or a similar material with high thermal conductivity and has almost the same size as that of the printed circuit board 31 for the server unit. As shown in the sectional view of FIG. 2, the heat sink 33 is installed so that it makes contact with highly heat-generating members mounted on the printed circuit board 31 for the server unit, such as the CPU 311 and memory chip, via a heat-conductive sheet 313 or the like. To radiate heat from a heat-generating area by the entire heat sink 33, a heat pipe 331 is provided so that it runs from the heat-generating area to a lower-temperature area. Thus, heat is distributed across the heat sink 33.

As illustrated in FIG. 3, a server unit cabinet 1 accommodates multiple said server units 3 and multiple power sources such as constant-voltage power sources. A front panel located on the front lower part of the server unit cabinet 1 is provided with, e.g., three external signal input/output connectors 29 for each server unit. For example, 10 server unit cabinets 3 are stacked in a server unit rack.

Multiple cartridge type server units 3 are accommodated in the server unit cabinet 1, and one power source 7 is also accommodated for each group consisting of several server units 3 therein. To the cartridge type server unit 3 accommodated in the server unit cabinet 1, an extension board (daughter board) 5 which extends the functions of the cartridge type server unit 3 may be connected.

As illustrated in FIGS. 4 and 5, the server unit cabinet 1 is configured so as to provide a server unit space 11, a power source space 13, a signal transmission means space 15, a cooling space 17, a wiring circuit board 19, and an external signal input/output connector 29.

The server unit space 11 is used to accommodate multiple server units 3. As illustrated in FIG. 4, a guide rail 12 which guides and supports the server unit 3 so that a main connector provided on the server unit 3 is connected to a server unit connector 23 on the wiring circuit board 19, is provided in the server unit space 11.

The power source space 13 is used to install the constant-voltage power source 7 which converts the electric energy received from a commercial power source or a similar external power source into server drive voltage and which makes said voltage constant and then outputs it to the server unit 3. Said power source space 13 is laid out next to the server space 11. In addition, guiding means which, though not illustrated, guides the constant-voltage power source 7 so that a connector provided on the constant-voltage power source 7 is connected to a power connector 25 provided on the wiring circuit board, are provided in the power source space 13.

Various kinds of units other than the constant-voltage power source 7, which are common to multiple server units 3, may be installed in the power source space 13.

The signal transmission means space 15 is used to accommodate wiring and other connection means such as a connection cord with a connector. Said signal transmission means space 15 is provided below the server unit space 11 and the power source space 13.

The cooling space 17 is used to have cooling fans 171 and 172 provided on the rear of the server unit cabinet 1, so that air is carried out of the server unit space 11 and the power source space 13. The cooling space 17 is laid out behind the server unit space 11 and the power source space 13. One cooling fan 171 is installed for multiple server units 3, and one cooling fan 172 for one power source.

A wiring circuit board 19 is located behind the server unit space 11, the power source space 13, and the signal transmission means space 15. A wiring circuit board 29 is, for example, formed as a printed circuit board and has (a) server connectors 23, the number of which corresponds to the number of server units 3 to be accommodated in the server unit cabinet 1, and which are located in positions corresponding to the server unit space 11, (b) power connectors 25, the number of which corresponds to the number of power sources 7 located in position corresponding to the power source space 13, and signal input/output points 27 located in positions corresponding to the signal transmission means space 13.

A server connector has a signal input/output terminal which is used to input signals to and output signals from signals a server unit 3, and a power outlet terminal which is used to supply the server unit with constant voltage. The server connector is oriented toward the server unit space 11.

A power connector 25 consists of an external power outlet terminal which is used to supply electric power from an external power source to the constant-voltage power source 7 connected to said external power source, and a constant-voltage terminal which is used to supply constant-voltage power from the constant-voltage power source to the power inlet terminal of the server unit connector 23. Said power connect 25 is oriented toward the power source space 13.

A signal input/output point 27 is used to send signals from the server unit 3 to the external signal input/output connector 29 and formed as a relay connector or a connection terminal.

The power outlet terminal of the server connector 23 and the constant-voltage terminal of the power connector 25 are connected by wiring on the wiring circuit board 19. The signal input/output terminal and signal input/output point of the server connector 23 are connected by wiring on the wiring circuit board 19.

The external signal input/output connectors 29 are provided, in the numbers corresponding to the number of server units 3 to be accommodated in the server unit cabinet 1, on the front panel 21 of the server unit cabinet 1. Said external signal input/output connectors 29 are connected to signal input/output points on the wiring circuit board via connection means. For said connection means, e.g., serial signal connectors such as RS-232C connectors, and LAN connectors are used.

The input/output points 27 and external signal input/output connectors 29 on the wiring circuit board are connected using the connection means 28 such as wiring or cords having a connector.

To accommodate the server unit 3 in the server unit cabinet 1 which has said configuration, the printed circuit board 31 for the server unit 3 is guided into an inner side by the guide rail 12. Then, the main connector 37 completes the connection between the server unit 3 inserted into the server connector 23 and the external signal input/output connector 29, thus enabling signal input to and output from the external signal input/output connector 29 provided on the front.

Similarly, to mount the power source 7 in the server unit cabinet 1, the constant-voltage power source 7 is guided via guiding means and then a connector provided thereon is connected to the power connector 25 provided on the wiring circuit board 19. Thus, the connections between the external power source, the constant-voltage power source 7, and each server unit 3 are completed very easily.

Figure 6:
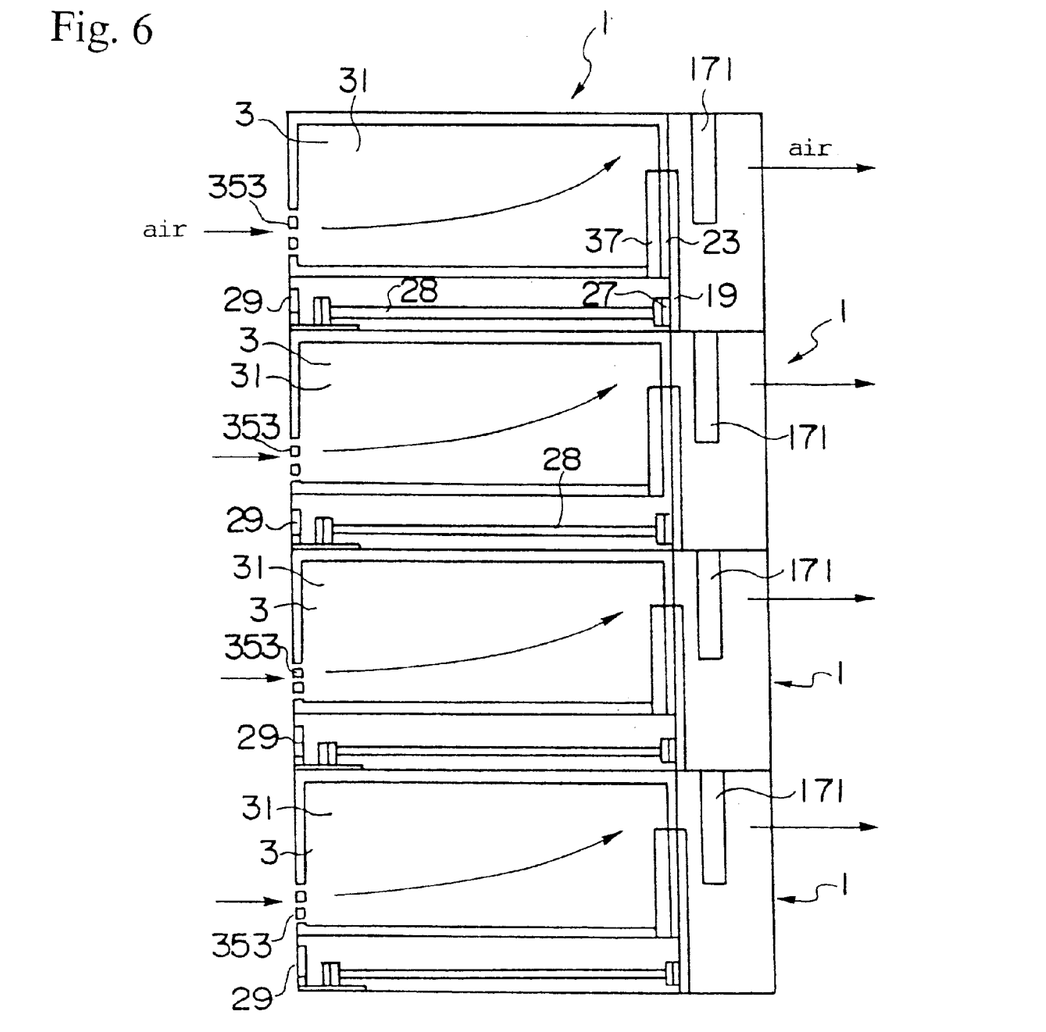
FIG. 6 is a vertical sectional illustration showing the state in which cabinets for accommodating server units are installed in a server unit rack.

Referring to FIG. 6, this paragraph describes how each server unit cabinet accommodating multiple server units 3 is cooled when the server unit cabinet is installed in the server unit rack. FIG. 6 is a vertical sectional view schematically illustrating a state wherein multiple server units 1 are stacked in the server unit rack. As illustrated in this figure, the server unit space 11 in the server unit cabinet 1 is a closed space except for the front and rear thereof. Therefore, when the server unit cooling fan 171 located in the cooling fan space 17 is operated, air flows, along the heat sink 33, from the air vents 353 provided on the lower part of the front panel 35 of the server unit 3 to the server unit cooling fan 171. Since the heat sink 33 is provided with a heat pipe which transmits heat from the heat-generating part on the printed circuit board 31 to another part, the heat can be taken out efficiently.

As described above, according to this invention, the server unit 3 is formed on the printed circuit board 31 which has a CPU and memory without a power source, and designed as a cartridge type having the main connector 37 on the rear thereof. The server unit cabinet 1 is provided with the server connector 23 which is connected to the external signal input/output connector 29 located on the front of the server unit cabinet 1. Therefore, merely inserting the cartridge type server unit 3 into the server unit cabinet completes the wiring. This allows for greatly simplifying the wiring for adding any server unit and prevents any connection error.

The invention eliminates the power source from the server unit 3, allowing for downsizing the section having the server function. In addition, the printed circuit board 31 incorporating the server function is positioned vertically and the heat sink is provided to enable efficient cooling. Thus, multiple server units can be installed in a single server unit rack so that the space for installing the server units can be greatly saved.

We claim:

1. A server unit comprising multiple server unit cabinets stacked in a server unit rack, each said server unit cabinet accommodating multiple cartridge type server units, each said cartridge type server unit comprising:
   a printed circuit board for a server unit, which is equipped with a central processing unit and main memory and which serves as a computer with the supply of external electric power at constant voltage;
   a heat sink supported by the printed circuit board for the server unit; and
   a front panel which supports the printed circuit board for the server unit; wherein
      the front panel supports the printed circuit board for the server unit so that a flat surface of the printed circuit board for the server unit is positioned vertically when the server unit is installed,
      a part of the heat sink makes contact with highly heat-generating components mounted on the printed circuit board for the server unit via heat conduction means,
      the heat conduction means are provided to transmit heat from said contacting part to another part of the heat sink, and
   each said server unit cabinet for accommodating multiple cartridge type server units and a constant-voltage power source comprising:
   a server unit space for accommodating said multiple server units;
   a power source space for mounting at least one said constant-voltage power source;
   a signal transmission space for accommodating signal transmission means; and
   a cooling space for accommodating cooling means; wherein
      said server unit cabinet is equipped with a server unit connector having a signal input/output terminal and a constant-voltage outlet terminal, and with a power connector having a signal input/output point, an external power inlet terminal, and a constant-voltage power inlet terminal;
      and that said server unit cabinet provides;
      (a) a wiring circuit board which includes wiring between the constant-voltage inlet terminal of the power connector and the constant-voltage outlet terminal of the server unit connector, and wiring between the signal input/output terminal of the server unit connector and the signal input/output point,
      (b) an external signal input/output connector provided on the server unit cabinet, and
      (c) a signal transmission means which connects between said external signal input/output connector and the signal input/output point of said wiring circuit board.

2. A server unit according to claim 1, wherein said heat conduction means is a heat pipe extending from a heat-generating area to a lower-temperature area, said heat pipe provided to an outer side of said heat sink.

3. A server unit according to claim 1, wherein said server unit cabinet accommodates one constant-voltage power source per a number of cartridge type server units.

4. A server unit according to claim 1, wherein said signal transmission space is provided below said server unit space and said power source space.

5. A server unit according to claim 1, wherein said signal input/output point is formed as a relay connector or a connection terminal.

6. A server unit comprising multiple server unit cabinets stacked in a server unit rack, each said server unit cabinet accommodating multiple cartridge type server units, each said cartridge type server unit comprising:
   a printed circuit board for a server unit, which is equipped with a central processing unit and main memory and which serves as a computer with the supply of external electric power at constant voltage;
   a heat sink supported by the printed circuit board for the server unit;
   a front panel which supports the printed circuit board for the server unit; and
   an extension connector to which an extension board is connected provided on one surface of the printed circuit board for the server unit; wherein
      the front panel supports the printed circuit board for the server unit so that a flat surface of the printed circuit board for the server unit is positioned vertically when the server unit is installed, a part of the heat sink makes contact with highly heat-generating components mounted on the printed circuit board for the server unit via heat conduction means, the heat conduction means are provided to transmit heat from said contacting part to another part of the heat sink, and each said server unit cabinet for accommodating multiple cartridge type server units and a constant-voltage power source comprising:

a server unit space for accommodating said multiple server units;

a power source space for mounting at least one said constant-voltage power source;

a signal transmission space for accommodating signal transmission means; and a cooling space for accommodating cooling means; wherein said server unit cabinet is equipped with a server unit connector having a signal input/output terminal and a constant-voltage outlet terminal, and with a power connector having a signal input/output point, an external power inlet terminal, and a constant-voltage power inlet terminal;

and that said server unit cabinet provides;

(a) a wiring circuit board which includes wiring between the constant-voltage inlet terminal of the power connector and the constant-voltage outlet terminal of the server unit connector, and wiring between the signal input/output terminal of the server unit connector and the signal input/output point, (b) an external signal input/output connector provided on the front of the server unit cabinet, and (c) a signal transmission means which connects between said external signal input/output connector and the signal input/output point of said wiring circuit board.

7. A server unit according to claim 6, wherein said heat conduction means is a heat pipe extending from a heat-generating area to a lower-temperature area, said heat pipe provided to an outer side of said heat sink.

8. A server unit according to claim 6, wherein said server unit cabinet accommodates one constant-voltage power source per a number of cartridge type server units.

9. A server unit according to claim 6, wherein said signal transmission space is provided below said server unit space and said power source space.

10. A server unit according to claim 6, wherein said signal input/output point is formed as a relay connector or a connection terminal.

* * * * *